United States Patent
Sood et al.

(10) Patent No.: US 9,438,244 B2
(45) Date of Patent: Sep. 6, 2016

(54) CIRCUITS FOR AND METHODS OF CONTROLLING POWER WITHIN AN INTEGRATED CIRCUIT

(71) Applicant: Xilinx, Inc., San Jose, CA (US)

(72) Inventors: Santosh Kumar Sood, New Delhi (IN); Brian C. Gaide, Erie, CO (US); Steven P. Young, Boulder, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/526,192

(22) Filed: Oct. 28, 2014

(65) Prior Publication Data

US 2016/0118988 A1    Apr. 28, 2016

(51) Int. Cl.
*G05F 1/10* (2006.01)
*H03K 19/177* (2006.01)
*H03K 19/00* (2006.01)

(52) U.S. Cl.
CPC .... *H03K 19/17784* (2013.01); *H03K 19/0008* (2013.01)

(58) Field of Classification Search
CPC .................... H03K 19/0016; H03K 19/17784
See application file for complete search history.

(56) References Cited

U.S. PATENT DOCUMENTS

| | | | |
|---|---|---|---|
| 5,430,393 A * | 7/1995 | Shankar | H03K 19/0016 327/142 |
| 7,355,440 B1 | 4/2008 | Santurkar et al. | |
| 7,490,302 B1 | 2/2009 | Rahman et al. | |
| 7,504,854 B1 * | 3/2009 | Look | G11C 5/14 326/38 |
| 7,853,811 B1 | 12/2010 | Walstrum, Jr. et al. | |
| 7,921,402 B2 | 4/2011 | He | |
| 8,145,923 B2 | 3/2012 | Lakkapragada et al. | |
| 8,261,101 B1 | 9/2012 | Wijaya et al. | |
| 8,823,405 B1 | 9/2014 | Trimberger | |
| 2009/0039952 A1 | 2/2009 | Wang et al. | |
| 2011/0090000 A1 * | 4/2011 | Tominaga | H03K 19/0016 327/540 |
| 2011/0198941 A1 | 8/2011 | Suzuki et al. | |
| 2011/0198942 A1 | 8/2011 | Takayanagi et al. | |
| 2014/0312483 A1 | 10/2014 | Vo et al. | |
| 2015/0198933 A1 * | 7/2015 | Coutts | H03K 19/0016 307/115 |

OTHER PUBLICATIONS

Rimolo-Donadio, Renato et al., "Asynchronous Staggered Set/Reset Techniques for Low-Noise Applications," *2007 IEEE International Symposium on Circuits and Systems*, May 27, 2007, pp. 1799-1802, IEEE, Piscataway, New Jersey, USA.

* cited by examiner

*Primary Examiner* — Jeffrey Zweizig

(74) *Attorney, Agent, or Firm* — John J. King

(57) ABSTRACT

A circuit for controlling power within an integrated circuit comprises a plurality of circuit blocks; a global control signal routed within the integrated circuit; and a plurality of power control blocks. Each power control block is coupled to a corresponding circuit block of the plurality of circuit bocks and has a first input coupled to receive a reference voltage and a second input coupled to receive the global control signal. The global control signal enables, for each circuit block, the coupling of the reference voltage to the corresponding circuit block. A method of controlling power within an integrated circuit is also disclosed.

18 Claims, 9 Drawing Sheets

| Operating Mode | Enable 1 | Enable 2 | Global | MC_S0, MC_S1 | MC_S | PGATE |
|---|---|---|---|---|---|---|
| Power-up | 1 | X | X | X | X | On |
| Static | 0 | X | X | 00 | 0 | Off |
| | 0 | X | X | 00 | 1 | On |
| User Control | 0 | X | X | 01 | X | Fabric Control |
| Global Control | 0 | 1 | 1 | 10 | X | On |
| | 0 | 1 | 0 | 10 | X | Off |
| Hold | 0 | 0-1 | 0 | 10 | X | Hold state before Enable 2 is de-asserted |

US 9,438,244 B2

CIRCUITS FOR AND METHODS OF CONTROLLING POWER WITHIN AN INTEGRATED CIRCUIT

TECHNICAL FIELD

The present invention relates generally to integrated circuit devices, and in particular to circuits for and methods of controlling power within an integrated circuit device.

BACKGROUND

Power control and power reduction are important aspects of implementing an integrated circuit device, such as a programmable logic device (PLD) or an application specific integrated circuit (ASIC). Dynamic power gating control may be implemented in integrated circuits where a floor plan is divided into multiple power domains, with individual power control signals provided for each domain. The individual power domains can be turned OFF/ON by asserting the power control signals. However, various design constraints need to be satisfied for power gating control signals to provide a robust power gating solution. For example, supply bounce and in-rush currents must be controlled in the sleep and wake-up sequencing of the power domains.

An example of an application for global power gating is a redundant line card in an integrated circuit, such as a PLD. As the redundant line card becomes functional in response to an external interrupt, the entire fabric needs to wake up with well-defined in-rush current and supply bounce. This requires a dedicated staggered control signal in the user design, which powers up sets of fabric/logic in the design. However, conventional solutions of power sleep control (PSC) that distribute a dedicated staggered power gating signal are costly, because it is necessary to route this signal and have dedicated buffers for staggering the control signal.

SUMMARY

A circuit for controlling power within an integrated circuit is described. The circuit comprises a plurality of circuit blocks; a global control signal routed within the integrated circuit; and a plurality of power control blocks. Each power control block is coupled to a corresponding circuit block of the plurality of circuit bocks and has a first input coupled to receive a reference voltage and a second input coupled to receive the global control signal. The global control signal enables, for each circuit block, a coupling of the reference voltage to a first input of the corresponding circuit block.

According to another implementation, a circuit for controlling power within an integrated circuit comprises a plurality of circuit blocks; a plurality of control signals including a global control signal that is routed within the integrated circuit; and a plurality of power control blocks. Each power control block is coupled to a corresponding circuit block of the plurality of circuit bocks and has a selection circuit having a first input coupled to receive the global control signal and a second input coupled to receive a second control signal of the plurality of control signals. Variable delay in the routing of a reference voltage to the plurality of circuit blocks enables a staggered power-up of the plurality of circuit blocks when the global control signal is selected by the selection circuits of the power control blocks.

A method of controlling power within an integrated circuit is also described. The method comprises providing a plurality of circuit blocks; routing a global control signal within the integrated circuit; coupling each circuit block of the plurality of circuit blocks to a corresponding power control block of a plurality of power control blocks; coupling, for each power control block of the plurality of circuit blocks, a reference voltage to a first input of the power control block; coupling, for each power control block, the global control signal to a second input of the power control block; and coupling, for each circuit block of the plurality of circuit blocks, the reference voltage to the corresponding circuit block in response to the global control signal.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below describe a power sleep control (PSC) architecture that enables the reuse of an existing global control signal as power gating control; the use of inherent staggering built in the global control signal to control wakeup-sleep noise; implementing a last level of multiplexing to enable the shared signal to be used as power gating or normal functionality; a low cost PSC architecture with well-defined power up/down sequence(s); and various modes of operation, including a user control mode that provides power gating controlled by a user design. While the circuits and methods disclosed herein find particular application for a PSC architecture in FPGAs, they can be applied to other integrated circuits. They use an existing global control signal to enforce a well-defined wakeup and sleep protocol in the integrated circuit. The advantage of these circuits and methods is in leveraging an existing global control signal with its inherent staggered distribution mechanism to control in-rush currents and supply bounce during wakeup and sleep. The circuits and methods may also support other control modes for flexible power gating domains, as set forth below.

For example, a circuit for controlling power within an integrated circuit may comprise a global control signal routed within the integrated circuit; and a plurality of power control blocks, wherein each power control block is coupled to a corresponding circuit block of a plurality of circuit bocks and has a first input coupled to receive a reference voltage and a second input coupled to receive the global control signal; wherein the global control signal enables, for each circuit block, the coupling of the reference voltage to the corresponding circuit block. Because the global control signal is routed throughout the integrated circuit and will reach different circuit blocks at different times, the global control signal enables a staggered power-up of the circuit blocks.

Figure 1:
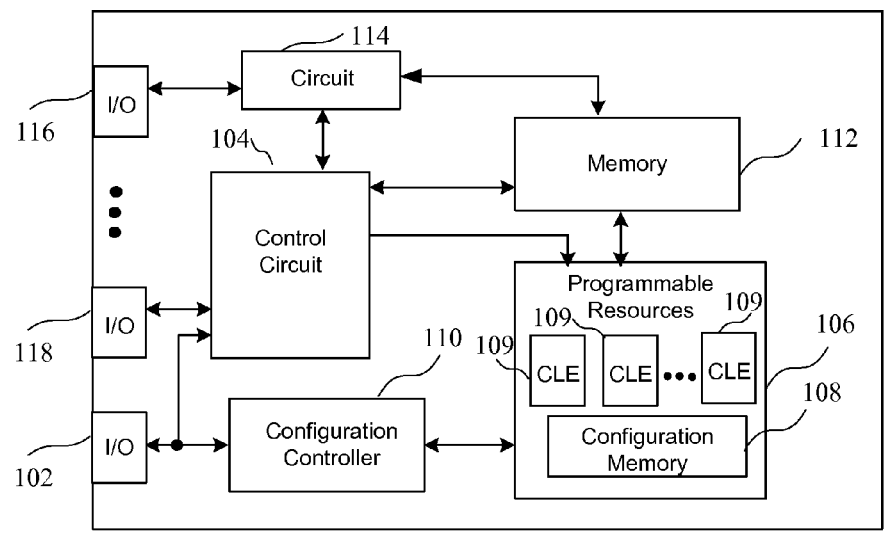
FIG. 1 is a block diagram of an integrated circuit device having circuits for controlling power.

Turning first to FIG. 1, a block diagram of an integrated circuit device having circuits for controlling power is shown. In particular, an input/output port 102 is coupled to a control circuit 104 that controls programmable resources 106 having configuration memory 108. Configuration data, which is described in more detail below in reference to FIGS. 10-12, may be provided to the configuration memory 108 by a configuration controller 110. The configuration data enables the operation of configurable elements 109, which are described in more detail in reference to FIG. 12. While CLEs are shown and described in detail below, it should be understood that the use of the global control signal to enables a staggered power-up may apply to any type of integrated circuit, and may enable to the staggered power up of circuit blocks other than CLEs. A separate memory 112, which may be a non-volatile memory for example, may be coupled to the control circuit 104 and the programmable resources 106. Another circuit 114 may be coupled to the control circuit 104 and the memory 112, and may communication signals external to the integrated circuit device by way of an I/O port 116. Other I/O ports may be coupled to circuits of the integrated circuit device, such as I/O port 118 that is coupled to the control circuit 104 as shown.

Figure 2:
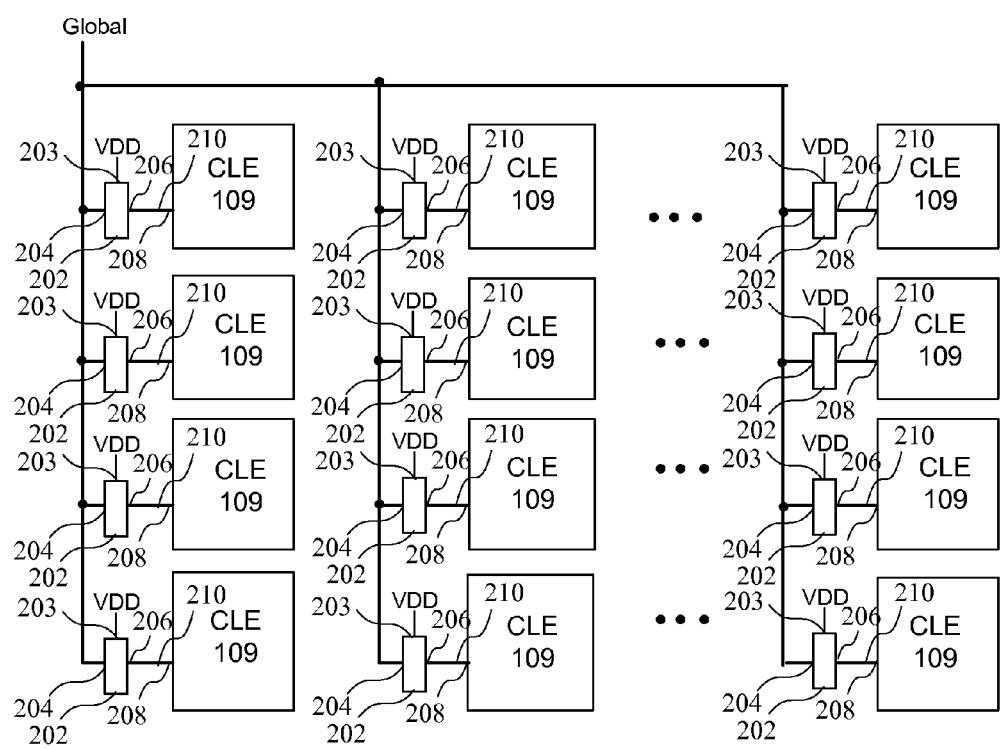
FIG. 2 is a block diagram of a portion of the programmable resources of FIG. 1 receiving a global control signal.

Turning now to FIG. 2, a block diagram of a portion of the programmable resources 106 receiving a global control signal ("Global") is shown. The circuit of FIG. 2 comprises a plurality of CLEs 109 each coupled to a corresponding power control block 202 that receives a reference voltage, shown here as a power reference voltage VDD, at a reference voltage input 203. While each of the power control blocks 202 receive the same reference voltage as shown, it should be understood that not all of the power control blocks need to be coupled to the same reference voltage, and some power control blocks may even be coupled to multiple reference voltages. Each power control block 202 also includes a power control input 204 coupled to receive a power control signal, shown here as the global control signal. An output 206 is coupled to an input 210 of the CLE by a signal line 208. Because the global control signal travels different distances to CLEs that are physically located in different regions of the integrated circuit device, the power up of the CLEs is staggered. That is, the circuit arrangement of FIG. 2 takes advantage of the delays in the routing paths of the global control signals to the CLEs to enable a staggered power-up or power-down of the CLEs.

Figure 3:
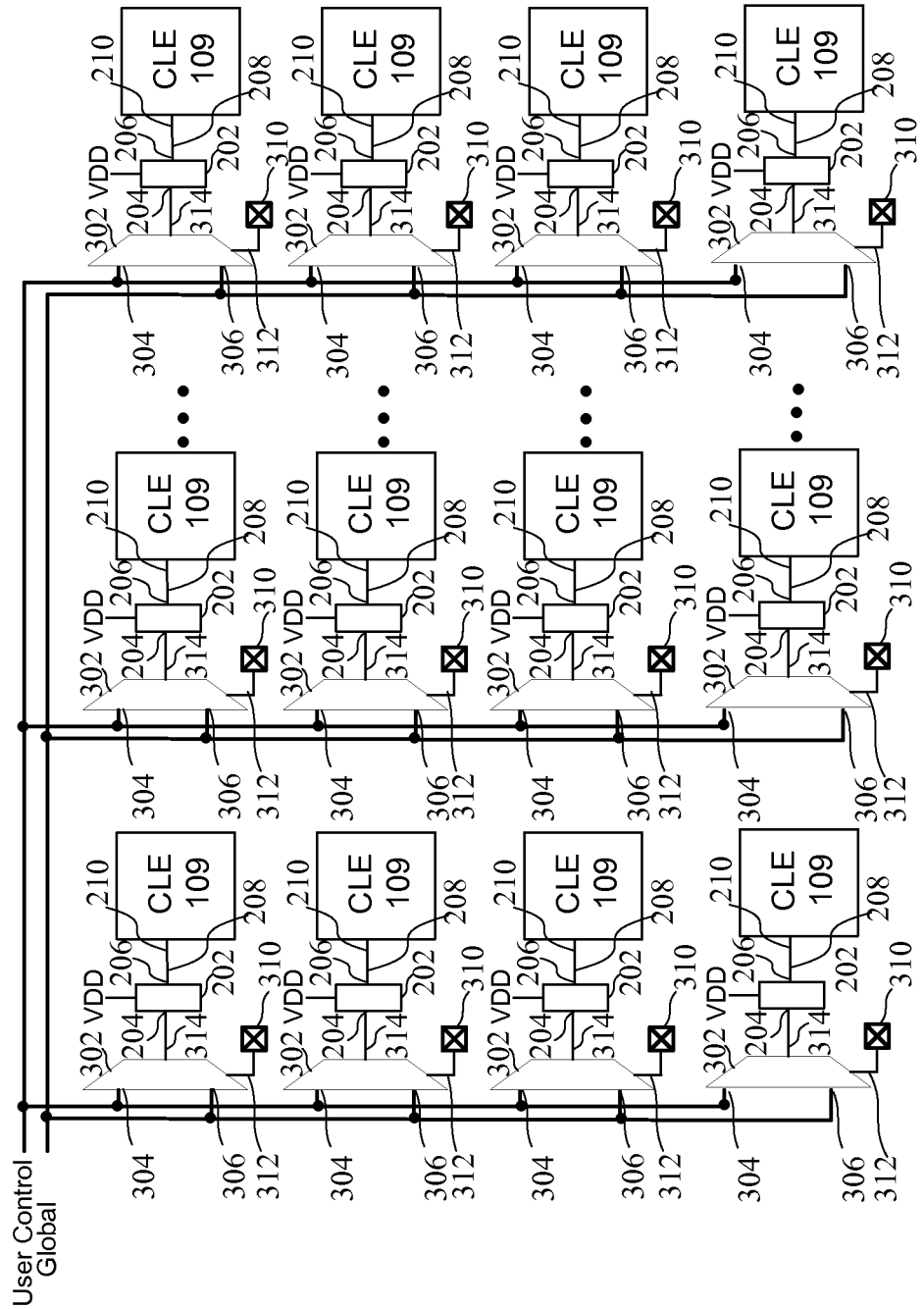
FIG. 3 is a block diagram of a portion of the programmable resources of FIG. 1 receiving a plurality of control signals.

Turning now to FIG. 3, a block diagram of a portion of the programmable resources 106 receiving a plurality of control signals is shown. According to the example of FIG. 3, a user-generated signal, such as a user control signal that may be generated by a circuit of the CLE for example, is provided in addition to the global control signal. That is, a user control signal is provided to a selection circuit 302, shown here as a multiplexer circuit, at a first input 304, while the global control signal is provided to a second input 306 of the selection circuit 302. A control signal 310, which may be a configuration bit stored in a configuration memory as described below, enables the selection of the user control signal or the global control signal at an output 314 by way of a control terminal 312.

Figure 4:
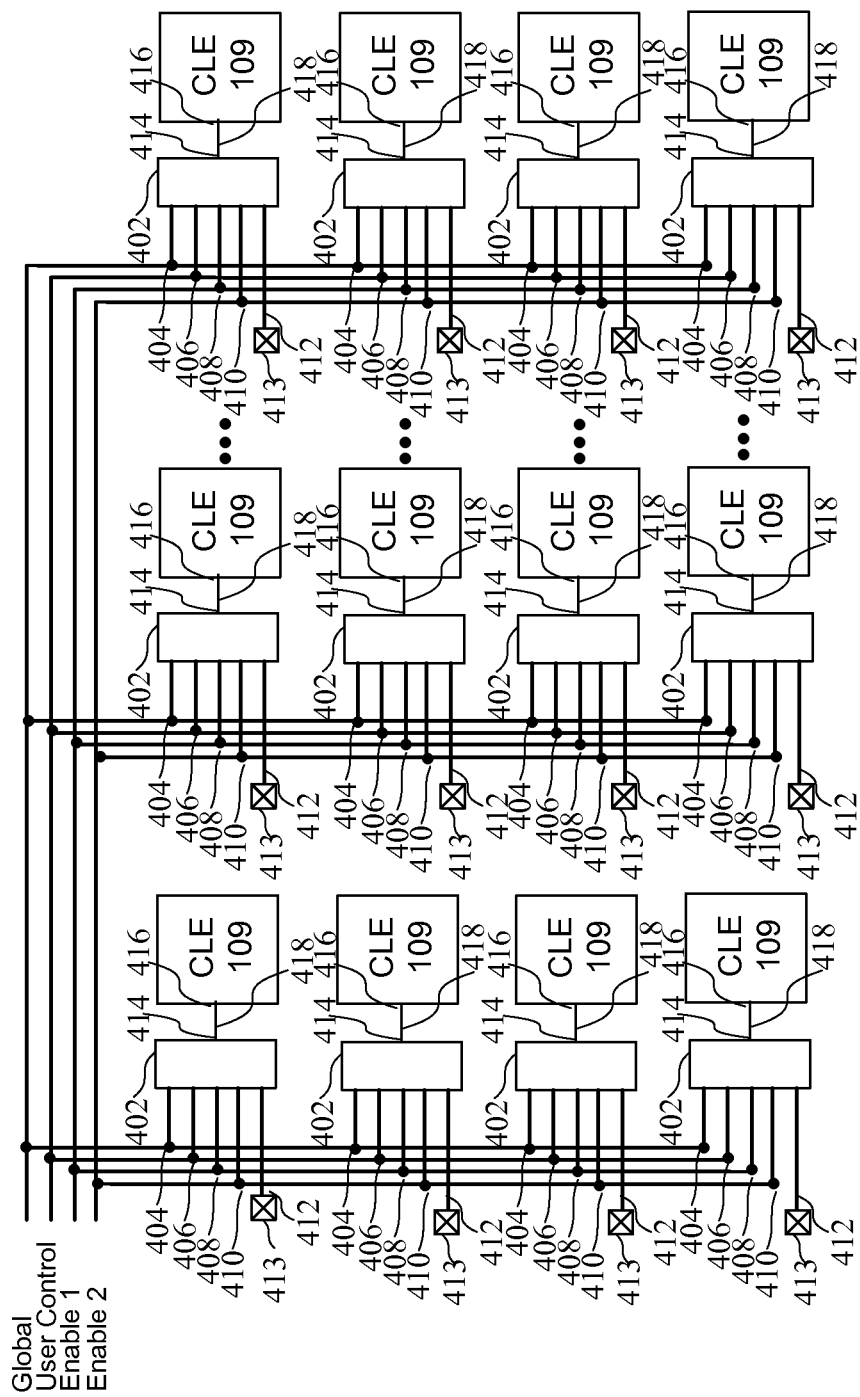
FIG. 4 is a block diagram of a portion of the programmable resources of FIG. 1 receiving a plurality of control signals and a static control mode signal.

Turning now to FIG. 4, a block diagram of a portion of the programmable resources receiving a plurality of control signals and a static control mode signal is shown. That is, different user-generated signals including a user control signal generated by a circuit of the integrated circuit, or a static control signal generated by a memory element of the integrated circuit, may be implemented. According to the implementation of FIG. 4, a plurality of control signals, including a static control signal, is coupled to a power control block 402, which is described in detail in reference to FIG. 5. More particularly, a global control signal is coupled to a first input 404, a user control signal is coupled to a second input 406, a first enable signal (Enable 1) is coupled to a third input 408, and a second enable signal (Enable 2) is coupled to a fourth input 410. A static signal may also be coupled to a fifth input 412, and may comprise another user-generated signal associated with a configuration bit 413 stored in configuration memory. An input 414 of the power control block is coupled to an input 416 by way of signal line 418. A circuit for enabling the selection and implementation of the plurality of control signals is shown and described below in reference to FIGS. 5-9.

Figures 5, 6:
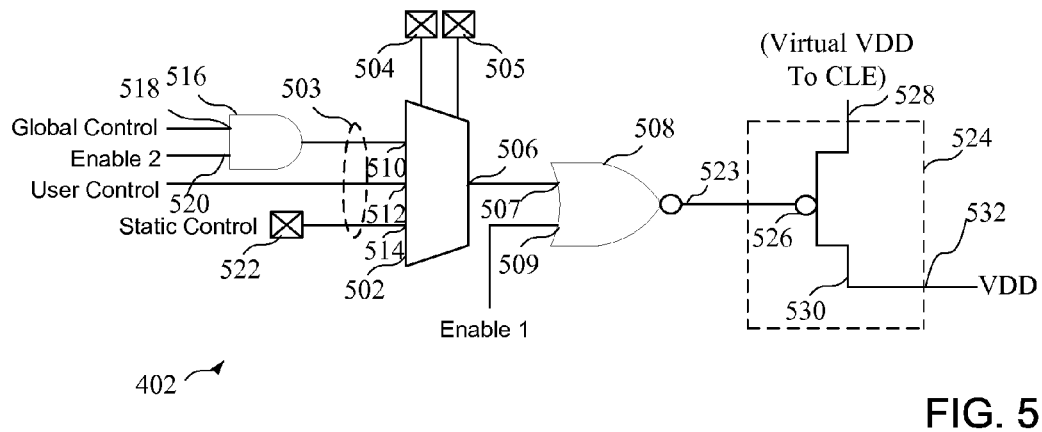
FIG. 5 is a block diagram of a power control block that could be used with configurable logic elements of an integrated circuit.
FIG. 6 is a table showing signal values associated with various operating modes of an exemplary power control block.

Turning now to FIG. 5, a block diagram of power control block that could be used with configurable logic elements of an integrated circuit is shown. In particular, the power control block 402 comprises a selection circuit 502 having a plurality of inputs 503 and receiving first and second power control signal MC_S0 and MC_S1 at corresponding inputs 504 and 505. An output 506 of the selection circuit 502 is coupled to a first input 507 of a NOR gate 508. A second input 509 of the NOR gate is coupled to receive the Enable 1 signal.

The selection circuit 502 comprises first, second, and third inputs 510-514 that are coupled to one of a plurality power control signals. In particular, latch 516 is coupled to receive the global control signal at a first input 518, which is a data input, and the Enable 2 signal at a second input 520, which is a control input. The latch 516 is triggered on a logic low control signal input on the second input 520. An output 521 of the latch 516 is coupled to the first input 510. The user control signal is coupled to the second input 512 of the selection circuit 502, while the static control signal (MC_S) (shown here as a configuration bit 522) is coupled to the input 514 of the selection circuit 502. While the user control signal may be generated by a circuit, such as another CLE of the integrated circuit, the static control signal may be generated by a memory element, such as a configuration bit stored in configuration memory for example.

An output 523 of the NOR gate 508 is coupled to a power gate 524, shown here as a p-channel transistor. That is, the output 523 of the NOR gate 508 is coupled to a gate 526, while the drain 528 (coupled to the CLE 109) provides a virtual power signal (Virtual VDD) from the source 530 to the CLE 109. The reference voltage VDD is coupled to the source 530 at an input 532 of the power gate 524, where the selected control signal enables the power gate, which functions as a switch, to route the reference voltage to generate the virtual power signal VDD for the CLE. It should be noted that the power gate 524 could be implemented in the power control block 202, for example.

An exemplary PSC architecture for a power domain is defined to have three control modes including a User Control mode, a Static mode, and Global Control mode, as shown in the table of FIG. 6, where X is designated as a "don't care" value. In the Static mode, the state of power gate 524 is defined by memory control bit MC_S, where the power domain is OFF when MC_S=0 and the power domain is ON when MC_S=1. The memory control bit MC_S may be downloaded as a configuration bit, as described in more detail below. Accordingly, in the Static mode the gate power is used to power down an un-used CLE, or program a certain CLE so that it is always on. As shown in FIG. 6, Enable 1 is a logical zero to enable the NOR gate 508 to follow the output of the selection circuit 502, and MC_S0 and MC_S1 are a "00" to select the Static Control signal. That is, when the Static Control signal provided by the memory element 522 is a logical zero (and Enable 1 is also a logical zero), the output of the NOR gate 508 will be high to turn off the power gate 524, while a static control signal having a logical 1 will turn on the power gate 524.

Figure 7:
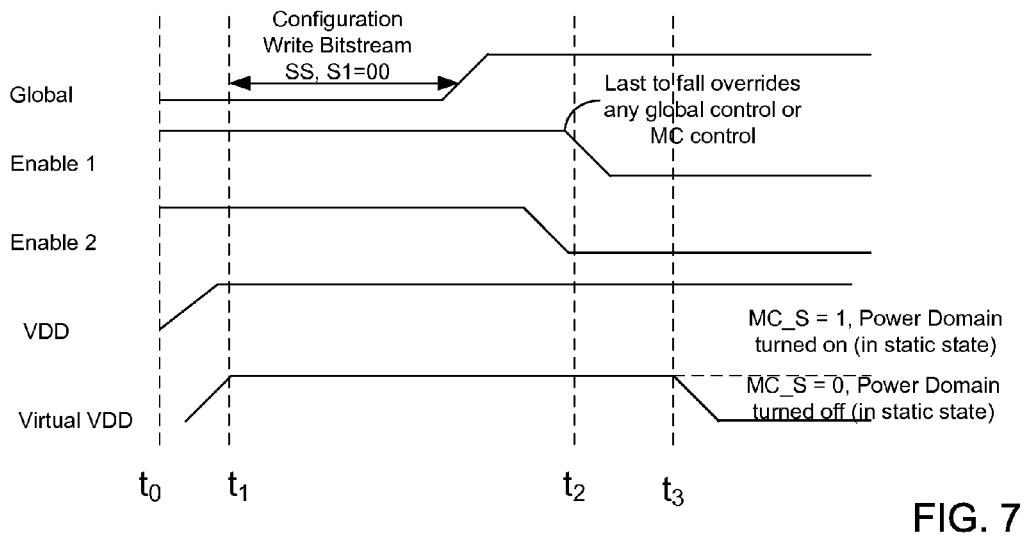
FIG. 7 is a timing diagram showing the operation of a power control block in a static mode.
Figure 8:
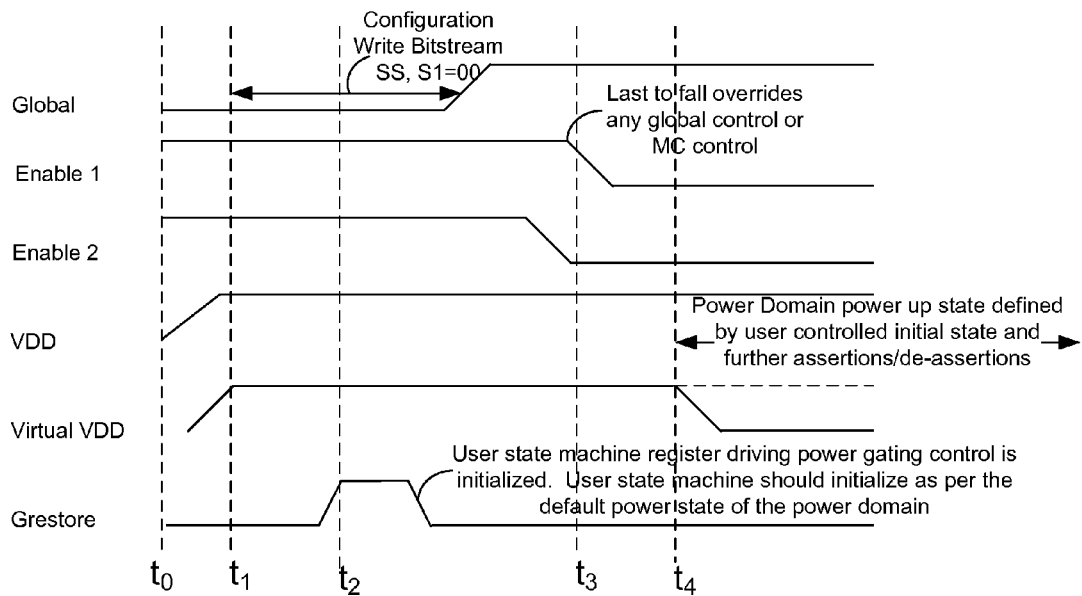
FIG. 8 is a timing diagram showing the operation of a power control block in a user control mode.

As shown in the timing diagram of FIG. 7, after the power signal VDD is initially applied at a time $t_0$ and reaches full power at time $t_1$, the initial configuration bitstream is written, where MC_S0 and MC_S1 are logical zeroes in the static mode. With Enable 1 initially high (i.e., a logical 1), and irrespective of the state of Enable 2 the virtual VDD is high, and the power domain for the CLE is turned-on. The circuit is in a Static Mode. The later of the Enable 1 or Enable 2 to fall, at a time $t_2$, overrides any global control or MC control. The virtual VDD then drops or stays high, as per value of MC_S at a time $t_3$, to place the CLE in a turned-off static mode/always ON mode.

In a User Control mode, the state of power gate 524 is defined by the User Control signal, where MC_S0 and MC_S1 are a "01" and the Enable 1 signal is a logical zero to enable the power control signal coupled to the power gate 524 to follow the User Control signal. That is, in the User Control mode, the user has to ensure the staggering of control signals for sleep/wake-up of large switching regions and allow for the implementation of custom power domains. As shown in the timing diagram of FIG. 8, state machine outputs (e.g., register outputs of circuits of the integrated circuit) drive the default power-up state of the power gate 524. Accordingly, a proper reset value of the registers that provide the default power-up state of the power gate 524 is loaded during the programming sequence. A "grestore" assertion at a time $t_2$ takes place in any bit programming sequence, and enables a user to initialize registers as desired as a default power-up state.

Figure 9:
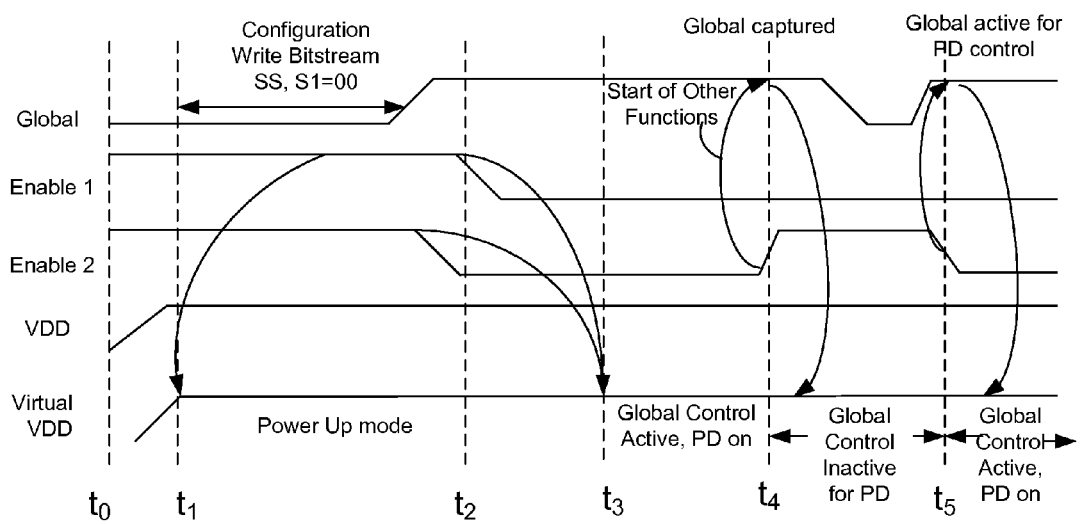
FIG. 9 is a timing diagram showing the operation of a power control block in a global control mode.

Finally, in a Global Control mode, the power control of the CLE is controlled by a global control signal implemented within a staggered sleep/wakeup sequence to avoid significant inrush currents. The timing diagram of FIG. 9 illustrates the use of the same global control signal for power gating at some time in the functional sequence, and for other functionality later in time. The virtual VDD, which is controlled by the same global control signal, can be turned on or off as desired. After the later of Enable 1 or Enable 2 to fall, at a time $t_2$, the global control signal is active and the power domain remains on or turns OFF at a time $t_3$, depending on the state of the global control signal. At time $t_4$ when Enable 2 goes high, the virtual VDD stays at its previous state (i.e., electrically high), as the previous value of the global control signal is captured for the purpose of power gating. Transitions of the global control signal between times $t_4$ and $t_5$ are ignored by the power gating. When the global control signal again goes high at a time $t_5$, the active global control signal is again captured for power domain control. Another system using global may be responsive to any transitions on global between $t_4$ and $t_5$. Global control is relieved of other functions at time $t_5$, and the power gating circuit becomes responsive to transitions on the global control signal at this time.

In the exemplary circuit, there are two additional functional states of the PSC to allow for well-defined power-up and using shared control for other tasks. The first additional state is the "power-up" state, where the PSC operation has to define the default power-up state before any of the functional modes become active. The PSC operation shown is designed to be always powered up as ON, and using the existing Enable 1 signal, which can be an existing signal such as a power on reset (POR) signal or a global enable (en_glob) signal, for example. Further, a "hold" state enables sharing the global control signal for other functionality. The current state of global control is captured based upon the Enable 2 control signal, signaling other control modes. For example, a "ghigh" signal is used as global power gating control can also be used for housecleaning in a partial re-configuration. At a start of a partial reconfiguration (asserted by a "gwe_b" as an Enable 2 signal), the power gating regions hold the current state until control is relieved by the partial reconfiguration, as signaled by the Enable 2 signal.

Figure 10:
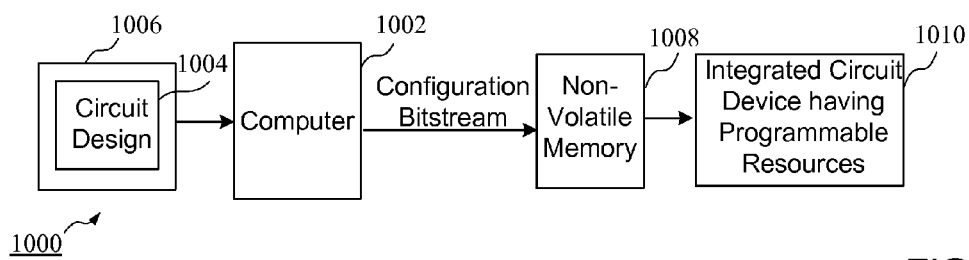
FIG. 10 is a block diagram of a system for programming a device having programmable resources.

Turning now to FIG. 10, a block diagram of a system for programming a device having programmable resources is shown. In particular, a computer 1002 is coupled to receive a circuit design 1004 from a memory 1006, and generates a configuration bitstream that is stored in the non-volatile memory 1006. As described in more detail below, the circuit design may be a high level design, such as a circuit design defined in a hardware description language (HDL). Also, the computer may be configured to run software that generates a configuration bitstream that is stored in the non-volatile memory 1008 and provided to an integrated circuit 910 that may be a programmable integrated circuit, such as the integrated circuit described below in FIG. 11. As described in more detail below, bits of the configuration bitstream are used to configure programmable resources of the integrated circuit.

Figure 11:
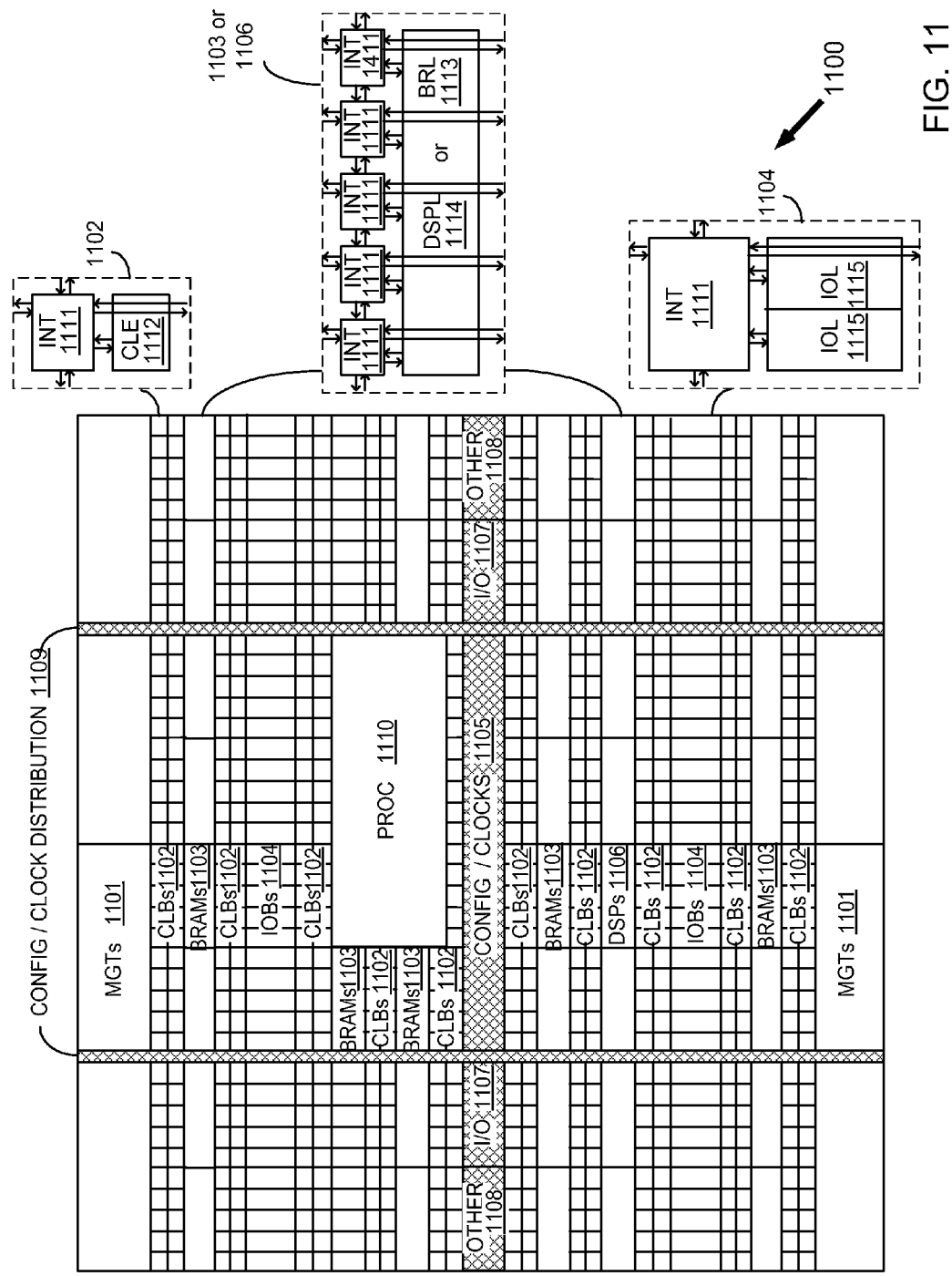
FIG. 11 is a block diagram of a device having programmable resources that may implement the circuits of FIGS. 1-5.

Turning now to FIG. 11, a block diagram of a device having programmable resources including the circuits of FIGS. 1-5 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 11 comprises an FPGA architecture 1100 having a large number of different programmable tiles including multi-gigabit transceivers (MGTs) 1101, CLBs 1102, random access memory blocks (BRAMs) 1103, input/output blocks (IOBs) 1104, configuration and clocking logic (CONFIG/CLOCKS) 1105, digital signal processing blocks (DSPs) 1106, specialized input/output blocks (I/O) 1107 (e.g., configuration ports and clock ports), and other programmable logic 1108 such as digital clock managers, analog-to-digital converters, system monitoring logic, and so forth. Some FPGAs also include dedicated processor blocks (PROC) 1110, which may be used to implement a software application, for example.

In some FPGAs, each programmable tile includes a programmable interconnect element (INT) 1111 having standardized connections to and from a corresponding interconnect element in each adjacent tile. Therefore, the programmable interconnect elements taken together implement the programmable interconnect structure for the illustrated FPGA. The programmable interconnect element 1111 also includes the connections to and from the programmable logic element within the same tile, as shown by the examples included at the top of FIG. 11.

For example, a CLB 1102 may include a configurable logic element (CLE) 1112 that may be programmed to implement user logic plus a single programmable interconnect element 1111. A BRAM 1103 may include a BRAM logic element (BRL) 1113 in addition to one or more programmable interconnect elements. The BRAM includes dedicated memory separate from the distributed RAM of a configuration logic block. Typically, the number of interconnect elements included in a tile depends on the height of the tile. In the pictured example, a BRAM tile has the same height as five CLBs, but other numbers may also be used. A DSP tile 1106 may include a DSP logic element (DSPL) 1114 in addition to an appropriate number of programmable interconnect elements. An IOB 1104 may include, for example, two instances of an input/output logic element (IOL) 1115 in addition to one instance of the programmable interconnect element 1111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured example, a columnar area near the center of the die is used for configuration, clock, and other control logic. The config/clock distribution regions 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear in order to facilitate the efficient implementation of user logic. While the example of FIG. 11 relates to an integrated circuit having programmable resources, it should be understood that the circuits and methods set forth in more detail below could be implemented in any type of integrated circuit, such as an ASIC.

Figure 12:
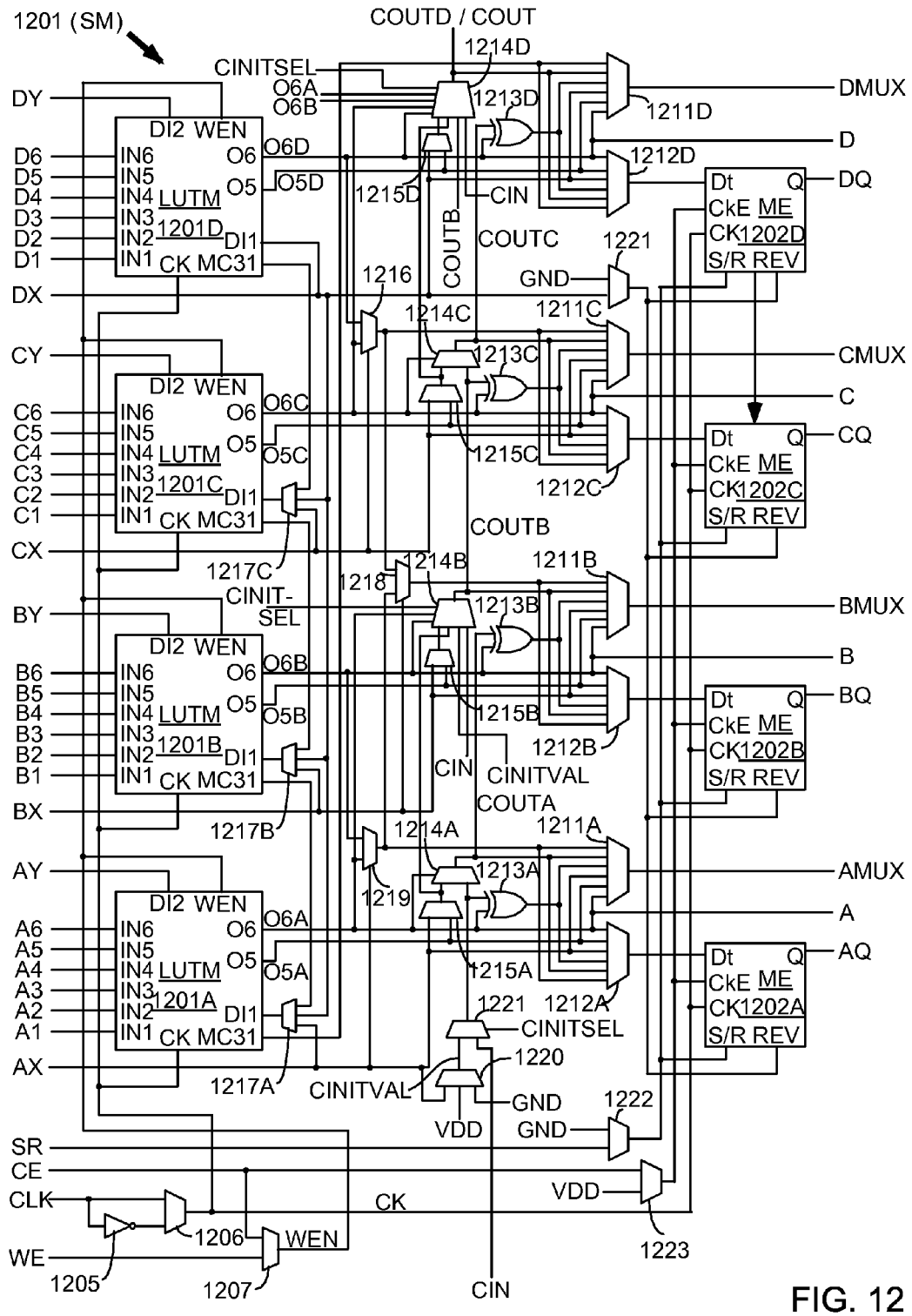
FIG. 12 is a block diagram of a configurable logic element of the device of FIGS. 1-5 and 11.

Turning now to FIG. 12, a block diagram of a configurable logic element of the device of FIG. 11 is shown. In particular, FIG. 12 illustrates in simplified form a configurable logic element of a configuration logic block 1102 of FIG. 11. In the example of FIG. 12, slice M 1201 includes four lookup tables (LUTMs) 1201A-1201D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1212D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic having multiplexers 1214A-1214D, 1215A-1215D, 1220-1221 and exclusive OR gates 1213A-1213D. All of these elements are coupled together as shown in FIG. 12. Where select inputs are not shown for the multiplexers illustrated in FIG. 12, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 12 for clarity, as well as from other selected figures herein.

In the pictured example, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-IN5), or as one 6-input LUT having input signals IN1-IN6.

In the example of FIG. 12, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. Accordingly, the circuits and methods set forth above may be implemented in a device such as the devices of FIGS. 12 and 12, or any other suitable device.

Figure 13:
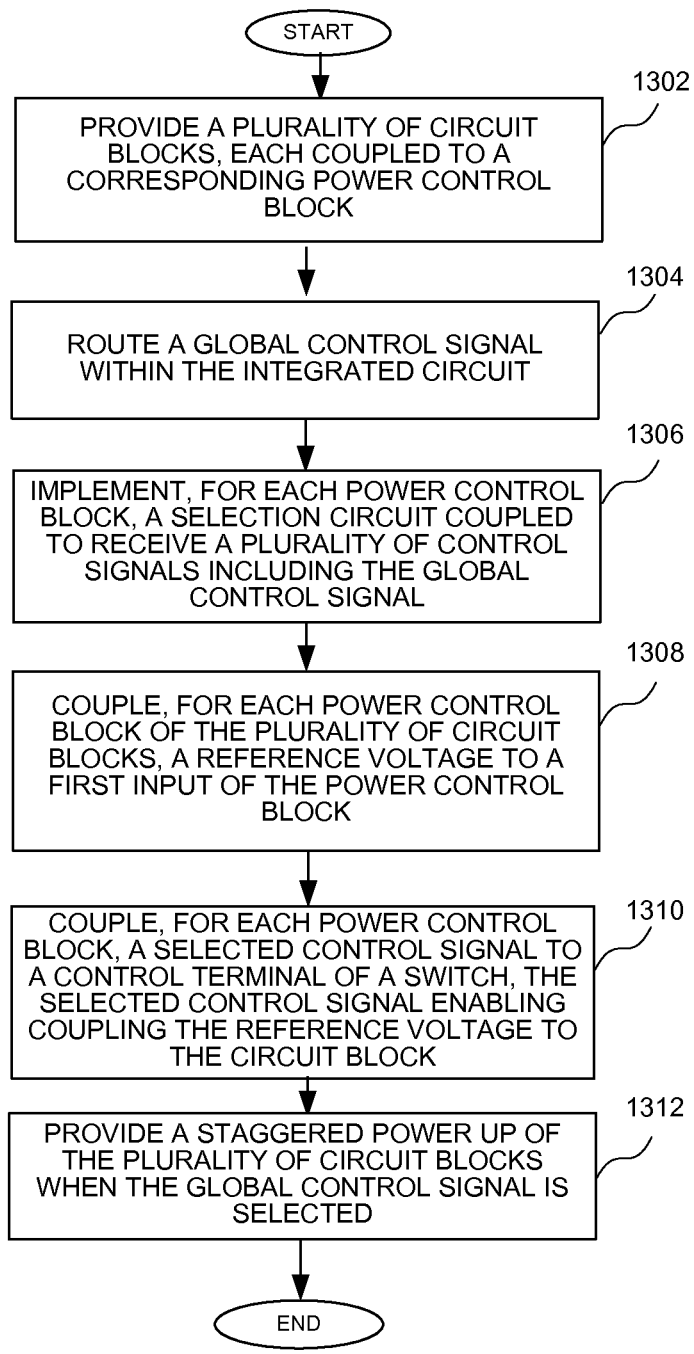
FIG. 13 is a flow chart showing a method of controlling power in an integrated circuit.

Turning now to FIG. 13, a flow chart shows a method of controlling power within an integrated circuit. In particular, a plurality of circuit blocks, each coupled to a corresponding power control block, is provided at a block 1302. A global control signal is routed within the integrated circuit at a block 1304. A selection circuit coupled to receive a plurality of control signals including the global control signal is implemented for each power control block at a block 1306. A reference voltage is coupled, for each power control block of the plurality of circuit blocks, to a first input of the power control block at a block 1308. A selected control signal is coupled, for each power control block, to a control terminal of a switch, the selected control signal enabling coupling the reference voltage to the circuit block at a block 1310. A staggered power up of the plurality of circuit blocks is provided when the global control signal is selected at a block 1312.

The various elements of the method of FIG. 13 may be implemented using the circuits of FIGS. 1-12 as described, or using some other suitable circuits. While specific elements of the method are described, it should be understood that additional elements of the method, or additional details related to the elements, could be implemented according to the disclosure of FIGS. 1-12.

It can therefore be appreciated that new circuits for and methods of controlling power within an integrated circuit have been described. It will be appreciated by those skilled in the art that numerous alternatives and equivalents will be seen to exist that incorporate the disclosed invention. As a result, the invention is not to be limited by the foregoing examples, but only by the following claims.

What is claimed is:

1. A circuit for controlling power within an integrated circuit, the circuit comprising:
   a plurality of circuit blocks;
   a global control signal routed within the integrated circuit; and
   a plurality of power control blocks, wherein each power control block is coupled to a corresponding circuit block of the plurality of circuit bocks and has a first input configured to receive a reference voltage and a second input configured to receive the global control signal;
   wherein each power control block further comprises a selection circuit having a first input configured to receive the global control signal, a second input configured to receive a second control signal, and a third input configured to receive a power control signal;
   wherein the global control signal when selected enables, for each circuit block, a coupling of the reference voltage to a first input of the corresponding circuit block; and
   wherein the power control signal enables, for each circuit block, a selection of the global control signal or the second control signal to enable an operating mode of the circuit block.

2. The circuit of claim 1, wherein variable delay in the coupling of the global control signal to inputs of the plurality of power control blocks enables a staggered power-up of the plurality of circuit blocks.

3. The circuit of claim 1, wherein:
   each power control block comprises a switch having a control terminal configured to receive the global control signal when selected; and
   the switch enables the coupling of the reference voltage to the corresponding circuit block.

4. The circuit of claim 1, wherein the second control signal comprises a user-generated signal.

5. The circuit of claim 4, wherein the user-generated signal comprises a static control signal.

6. The circuit of claim 1, wherein each power control block is further configured to receive an enable signal for enabling the coupling of the reference voltage to the plurality of circuit blocks during a power-up phase.

7. A circuit for controlling power within an integrated circuit, the circuit comprising:
   a plurality of circuit blocks;
   a plurality of control signals including a global control signal that is routed within the integrated circuit; and
   a plurality of power control blocks, wherein each power control block is coupled to a corresponding circuit block of the plurality of circuit bocks and has a selection circuit having a first input configured to receive the global control signal, a second input configured to receive a second control signal of the plurality of control signals, and a third input configured to receive a power control signal;

wherein variable delay in the routing of a reference voltage to the plurality of circuit blocks enables a staggered power-up of the plurality of circuit blocks when the global control signal is selected by the selection circuits of the power control blocks; and wherein the power control signal enables, for each circuit block, a selection of the global control signal or the second control signal to enable an operating mode of the circuit block.

8. The circuit of claim 7, wherein the plurality of circuit blocks comprise configurable logic blocks.

9. The circuit of claim 7, wherein:

each power control block comprises a switch having a control terminal coupled to a control signal; and the control signal enables coupling the reference voltage to the circuit block.

10. The circuit of claim 7, wherein the second control signal comprises a user generated signal.

11. The circuit of claim 10, wherein the user-generated signal comprises a user control signal.

12. The circuit of claim 10, wherein the user-generated signal comprises a static control signal.

13. The circuit of claim 7, wherein each power control block is further configured to receive an enable signal for enabling the coupling of the reference voltage during a power-up of the plurality of circuit blocks.

14. A method of controlling power within an integrated circuit, the method comprising:

providing a plurality of circuit blocks;

routing a global control signal within the integrated circuit;

coupling each circuit block of the plurality of circuit blocks to a corresponding power control block of a plurality of power control blocks, coupling, for each power control block of the plurality of circuit blocks, a reference voltage to a first input of the power control block;

coupling, for each power control block, the global control signal to a second input of the power control block;

implementing, for each power control block, a selection circuit having a first input configured to receive the global control signal, a second input configured to receive a second control signal, and a third input configured to receive a power control signal, wherein the power control signal enables, for each circuit block, a selection of the global control signal or the second control signal to enable an operating mode of the circuit block; and coupling, for each circuit block of the plurality of circuit blocks, the reference voltage to the corresponding circuit block in response to a selection of the global control signal.

15. The method of claim 14, wherein the coupling of the reference voltage to the corresponding circuit blocks comprises comprising providing a staggered power-up of the plurality of circuit blocks.

16. The method of claim 14, further comprising coupling, for each power control block, a control signal to a control terminal of a switch, the control signal enabling the coupling of the reference voltage to the corresponding circuit block.

17. The method of claim 14, wherein implementing a selection circuit comprises coupling a user generated signal to the second input.

18. The method of claim 14, further comprising coupling, for each power control block, an enable signal for enabling the coupling of the reference voltage during a power up-phase.

* * * * *